(12) United States Patent
Xu et al.

(10) Patent No.: US 11,606,100 B1
(45) Date of Patent: Mar. 14, 2023

(54) METHOD AND APPARATUS FOR ENHANCING DYNAMIC RANGE IN AN ANALOG-TO-DIGITAL CONVERTER

(71) Applicant: ESS Technology, Inc., San Jose, CA (US)

(72) Inventors: Yongsheng Xu, Kelowna (CA); Dustin Dale Forman, Kelowna (CA)

(73) Assignee: ESS Technology, Inc., San Jose, CA (US)

( * ) Notice: Subject to any disclaimer, the term of this patent is extended or adjusted under 35 U.S.C. 154(b) by 0 days.

(21) Appl. No.: 17/510,035

(22) Filed: Oct. 25, 2021

(51) Int. Cl.
*H03M 1/00* (2006.01)
*H03M 1/18* (2006.01)
*H03M 7/34* (2006.01)
*H03M 1/06* (2006.01)
*H03M 3/00* (2006.01)

(52) U.S. Cl.
CPC ......... *H03M 1/183* (2013.01); *H03M 1/0626* (2013.01); *H03M 3/30* (2013.01); *H03M 7/3051* (2013.01)

(58) Field of Classification Search
CPC ...... H03M 1/183; H03M 1/0626; H03M 3/30; H03M 7/3051
See application file for complete search history.

(56) References Cited

U.S. PATENT DOCUMENTS

| | | | | |
|---|---|---|---|---|
| 10,763,889 B1* | 9/2020 | Agarwal | ............... | H03M 3/486 |
| 2018/0358980 A1* | 12/2018 | Ruelke | ................... | H03G 3/008 |

FOREIGN PATENT DOCUMENTS

GB 2537697 * 10/2016 .............. H03M 1/18

* cited by examiner

*Primary Examiner* — Joseph J Lauture
(74) *Attorney, Agent, or Firm* — Gard & Kaslow LLP (57) ABSTRACT

Described herein is an apparatus and method for enhancing the dynamic range of an analog-to-digital converter (ADC). In one embodiment of the present approach, an analog input signal is amplified in a programmable gain amplifier (PGA) before the ADC receives the signal, so that the gain applied to an input signal, and gain (or attenuation) later applied in order to balance the overall gain of the circuit, occurs only in either the analog domain; in the prior art, gain occurs partly in each domain. The ADC gain is then adjusted to compensate for gain of the PGA and balance the overall gain of the circuit. In another embodiment, the ADC gain is adjusted, and gain of a digital gain element that receives the signal from the ADC is adjusted to compensate for the ADC gain and balance the overall gain of the circuit, eliminating the need for a PGA.

3 Claims, 8 Drawing Sheets

METHOD AND APPARATUS FOR ENHANCING DYNAMIC RANGE IN AN ANALOG-TO-DIGITAL CONVERTER

FIELD OF THE INVENTION

The present invention relates generally to analog-to-digital converters (ADCs), and more particularly to a method and apparatus for providing enhancement of the dynamic range of such ADCs.

BACKGROUND OF THE INVENTION

The noise floor of analog-to-digital converter (ADC) is the measure of the signal created from the sum of all the noise sources and unwanted signals within the ADC, where noise is defined as any signal other than the one being monitored. The dynamic range of an ADC depends upon the noise floor of the ADC; it is defined as the ratio between the maximum voltage the ADC can reliably measure and its noise floor.

In the case of an audio system, the dynamic range is the ratio of the largest to the smallest intensity of sound that can be reliably transmitted or reproduced by the system, measured in decibels. The dynamic range of an audio system is particularly important in applications such as far-field audio recording or speech pickup. In most cases, it is the dynamic range of the ADC, and thus its noise floor, that limits the dynamic range of an audio system containing the ADC.

To improve the dynamic range of an ADC, and thus of an audio system containing an ADC, a Dynamic Range Enhancement (DRE) circuit may be introduced. In the prior art, a programmable gain amplifier (PGA) is typically inserted in a system before the ADC to amplify low-amplitude signals before they are fed to the ADC. The gain of the PGA is adjusted dynamically depending on the input signal level.

Figure 1:
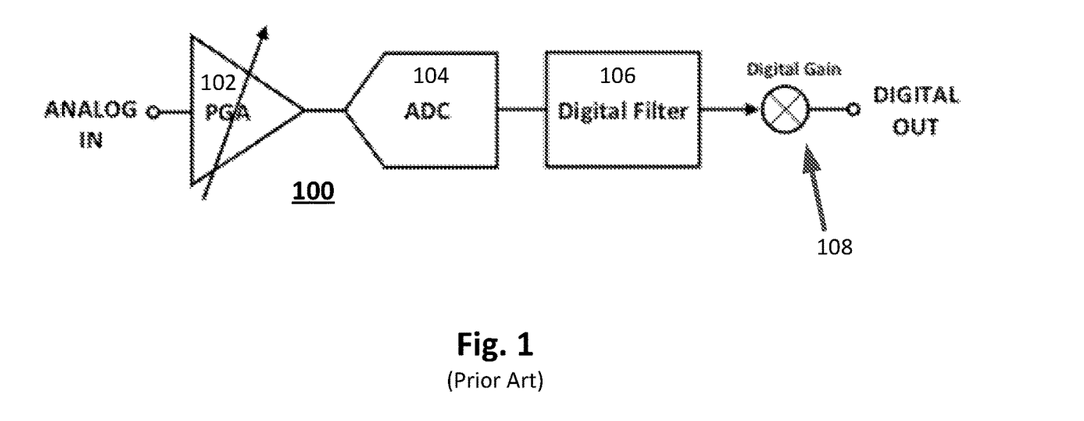
FIG. 1 is a block diagram of one implementation of a circuit that provides dynamic range enhancement of an ADC as is known in the prior art.

FIG. 1 is a block diagram of a simple prior art circuit 100 that provides dynamic range enhancement of an ADC. A PGA 102 amplifies an analog input signal, and an ADC 104 then digitizes the amplified input signal. The resulting digital signal may then be further processed by, for example, a digital filter 106, and amplified (or attenuated, i.e., negative gain) by a digital gain element 108.

The total referred noise $e_{total}$ at the input to PGA 102 can be expressed as:

$$e_{total} = \sqrt{e_{PGA}^2 + \left(\frac{e_{ADC}}{G}\right)^2}$$

where G is the gain of PGA 102, and $e_{PGA}$ and $e_{ADC}$ are the input referred noise voltages of PGA 102 and ADC 104, respectively. In order to obtain the desired greater dynamic range at the system level, PGA 102 is selected to have low input referred noise at its intended gain levels.

In practice, the gain of the entire signal chain of circuit 100 of FIG. 1 is kept constant to maintain signal fidelity. As above, the gain of PGA 102 is changed dynamically depending on the input signal level; the input signal level may be detected by circuitry such as a peak detector. Such a change in the gain of PGA 102 is then compensated for somewhere else along the signal chain.

Figure 2:
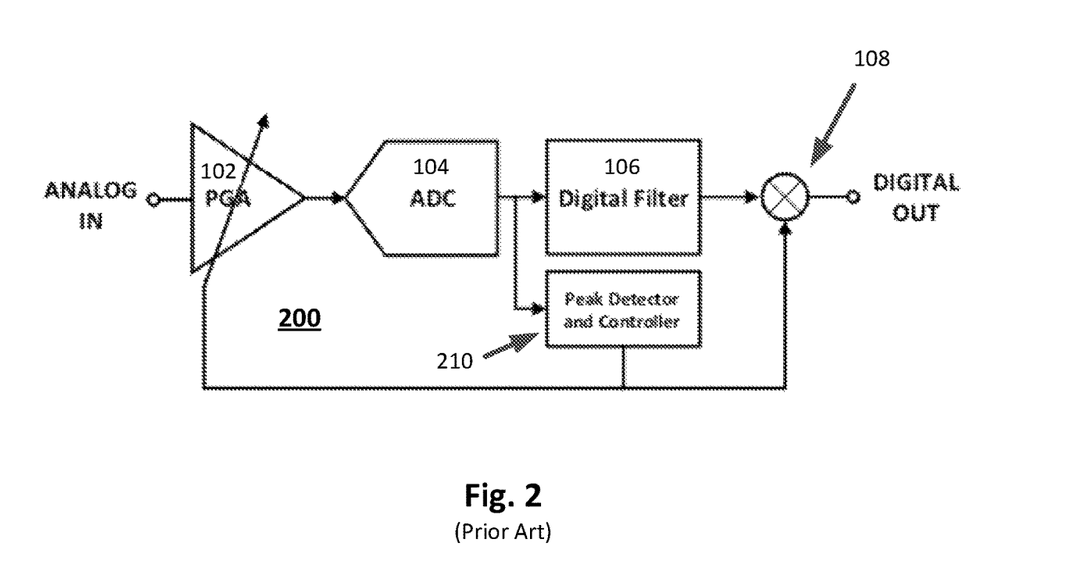
FIG. 2 is a block diagram of another implementation of a circuit that provides dynamic range enhancement of an ADC as is known in the prior art.

FIG. 2 is a block diagram of a circuit 200 that provides dynamic range enhancement of an ADC in another implementation as is known in the prior art, illustrating one way in which the gain of the circuit may be adjusted. In circuit 200, a peak detector and controller 210 detects the level of output from ADC 104, and thus by inference the input signal level, adjusts the gain of the PGA based upon that input signal level, and "balances" the gain by attenuating the signal in digital gain element 108 before the signal is output; the signal is attenuated by an amount corresponding to the gain G of PGA 102 so as to keep the gain of the signal chain unchanged. See, e.g., U.S. Pat. No. 10,763,889.

However, as is known in the art, because one gain is in the analog domain, i.e., the gain G of PGA 102, and the other is in the digital domain, i.e., the gain, or attenuation in digital gain element 108, this type of gain balancing is subject to certain issues such as gain synchronization, gain mismatch, etc. between those analog and digital gains.

Gain synchronization may vary with frequency due to the dispersion in the ADC and digital paths caused by the finite bandwidth of each of these blocks. A synchronization alignment in time at low frequency (e.g., under 500 Hertz) may be different from the alignment in time needed at higher frequencies (e.g., over 5 kiloHertz). This can make it difficult to provide an undetectable, i.e., inaudible, gain transition.

It would be desirable to be able to balance gain and obtain the desired dynamic range enhancement without these problems. Alternatively, it would be desirable to replace the PGA with a fixed-gain amplifier, or even eliminate the PGA or amplifier entirely.

SUMMARY OF THE INVENTION

Described herein an apparatus and method for enhancing the dynamic range of an analog-to-digital converter (ADC).

One embodiment describes a circuit that enhances the dynamic range of an analog-to-digital converter, comprising: a programmable gain amplifier configured to receive an analog input signal and produce an amplified analog signal; an analog-to-digital converter having adjustable gain and configured to receive and digitize the amplified analog signal, and to output a digital signal; and a controller configured to: detect the level of the analog input signal; and adjust the gain of the programmable gain amplifier and the gain of the analog-to-digital converter based upon the detected analog input signal level.

Another embodiment describes a method for enhancing the dynamic range of an analog-to-digital converter, comprising: amplifying, by a programmable gain amplifier, an analog input signal to produce an amplified analog signal; digitizing, by an analog-to digital converter having adjustable gain, the amplified analog signal to produce a digital signal; detecting, by a controller, the level of the analog input signal; adjusting, by the controller, the gain of the programmable gain amplifier and the gain of the analog-to-digital converter based upon the detected analog input signal level; and filtering, by a filter circuit, the digital signal to produce a filtered digital signal.

DETAILED DESCRIPTION OF THE INVENTION

Described herein an apparatus and method for enhancing the dynamic range of an analog-to-digital converter (ADC). In one embodiment of the present approach, gain applied to an input signal, and gain (or attenuation) later applied in order to balance the overall gain of the circuit, occurs entirely in the analog domain. This is in contrast to the prior art, in which the gain occurs partly in each domain, with a programmable gain amplifier (PGA) amplifying the analog input signal in the analog domain and a digital gain element applying gain to compensate in the digital domain.

In this embodiment of the present approach, an analog input signal is amplified in a programmable gain amplifier (PGA) before the ADC receives the analog signal. The gain of the ADC is then adjusted to compensate for the gain of the PGA and balance the overall gain of the circuit. In this embodiment, all of the gain and/or attenuation occurs in the analog domain.

In another embodiment of the present approach, rather than adjusting gain to the input signal in the PGA as in the prior art, gain in the ADC is adjusted, and then gain in a digital gain element that receives the digital signal from the ADC is also adjusted to compensate for the gain of the ADC and balance the overall gain of the circuit. In this embodiment, the PGA may be either replaced by a fixed-gain amplifier or even removed completely.

Having gain applied to the input signal, and the subsequent adjustment to balance the gain, occur entirely in the analog domain according to the first embodiment of the present approach avoids issues such as gain synchronization, gain mismatch, etc. that are seen in the prior art circuits in which the gain occurs partly in each domain.

As described above, in prior art circuits such as circuit 200 of FIG. 2, a digital gain element 108 attenuates the digital signal from the ADC to compensate for the amplification of the analog signal due to the gain of the PGA 102. The gain of the PGA and that of the digital gain element are thus attempted to be "matched" to balance the overall gain of the circuit.

By contrast, under the first embodiment of the present approach, the gain of the PGA and the gain of the ADC are matched, so that all of the gain occurs in the analog domain.

Figure 3:
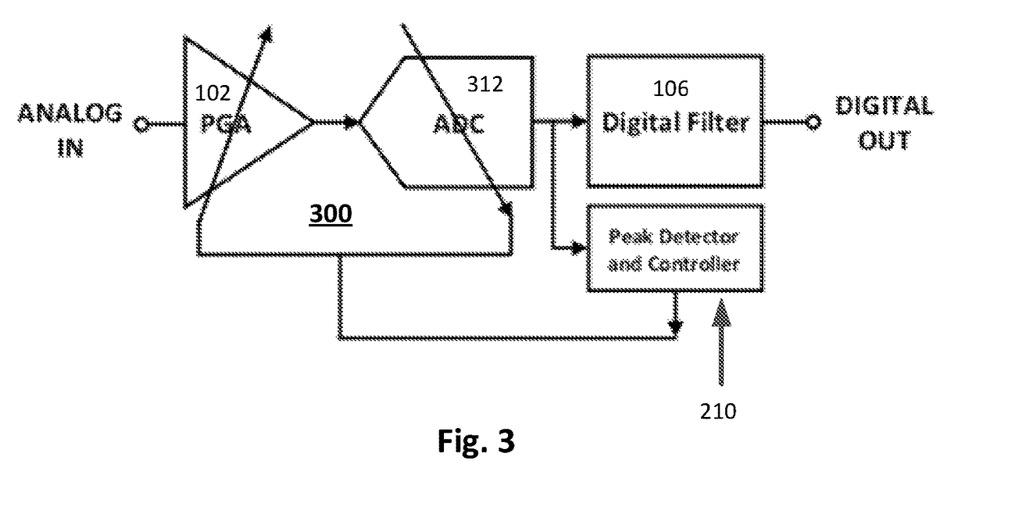
FIG. 3 is a block diagram of a circuit that provides dynamic range enhancement of an ADC according to one embodiment under the present approach.

FIG. 3 is a block diagram of a circuit 300 that provides dynamic range enhancement of an ADC according to the first of these two embodiments under the present approach. In circuit 300, an ADC 312 has an adjustable gain, unlike the ADC 104 of the prior art above, that is adjusted to compensate for the change of gain in PGA 102, in contrast to the prior art in which a digital gain element is used to compensate for the gain of PGA 102.

As in the prior art circuit 200 of FIG. 2, in circuit 300 a peak detector and controller (hereafter "controller") 210 is used to (indirectly) detect the signal level of the analog signal input to PGA 102, and a digital filter 106 may be used to filter the output of ADC 312. But unlike circuit 200, no digital gain element is present in circuit 300 as one is not needed due the compensation of gain in ADC 312 for the gain in PGA 102.

One of skill in the art will appreciate that controller 210, and its peak detection function, may be placed anywhere in circuit 300 (and in fact in circuit 200 of FIG. 2 as well), even potentially receiving the output of the PGA directly in analog form. Since it is known where gain and attenuation of the signal occurs, the peak detection levels may be adjusted according to where controller 210 is placed as long as the transition thresholds are lower than the gain of the circuit at that point. It will also be appreciated that, although for simplicity the controller is shown as generating only one output, i.e., control signal, the control signal that adjusts the gain of PGA 102 is not the same control signal that adjusts the gain of ADC 312; rather, PGA 102 and ADC 312 each receive independent control signals that cause the appropriate adjustments in their gain.

By adjusting the gain of ADC 312 to correspond to that of PGA 102, the gain balancing that allows for the dynamic range enhancement is performed seamlessly in the analog domain between the PGA and the ADC. This completely avoids the issues of gain synchronization, gain mismatch, etc., that occur in the prior art due to the combining of gain in the analog domain with gain in the digital domain.

Figure 6:
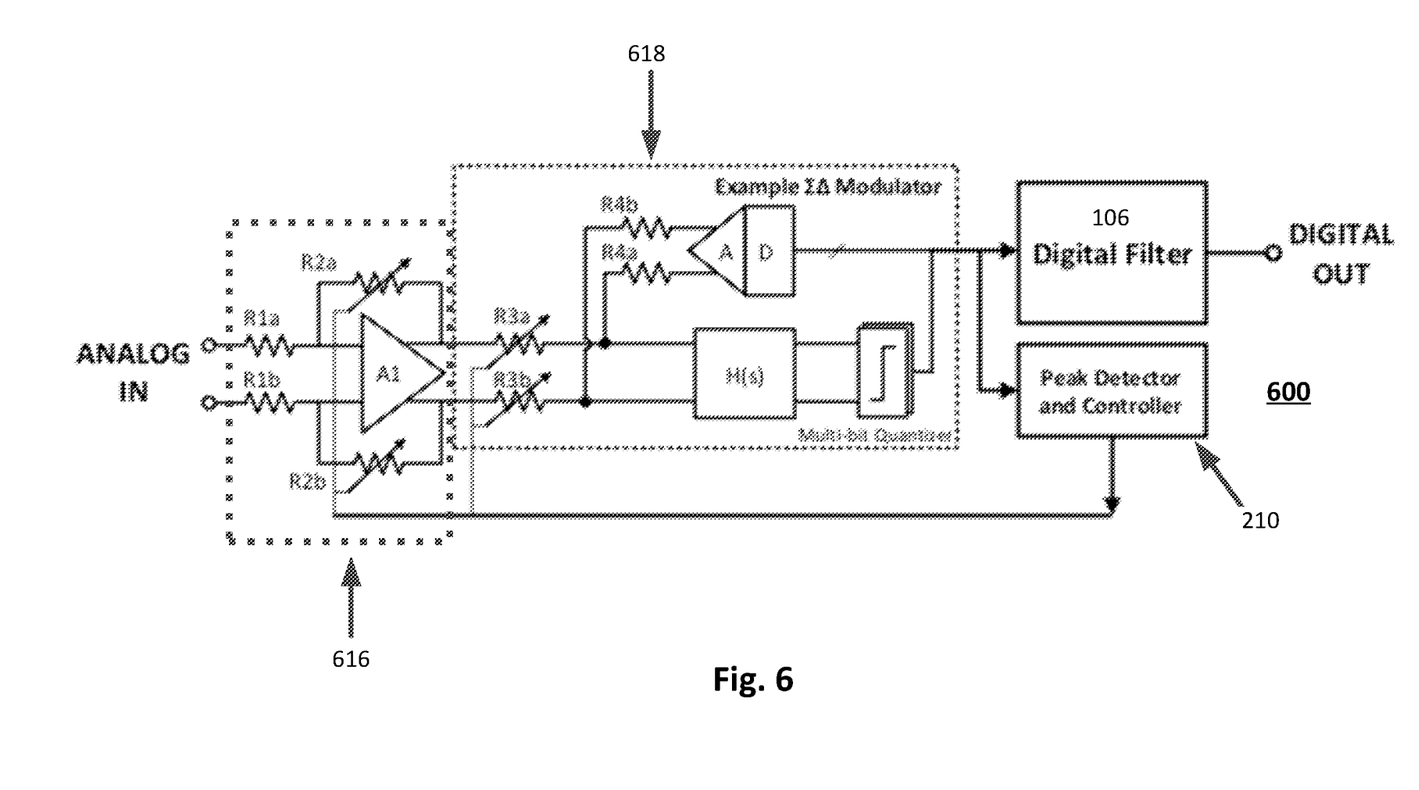
FIG. 6 is a diagram of a differential circuit that provides dynamic range enhancement of an ADC according to still another embodiment under the present approach.

FIG. 6 is a diagram of a circuit 600 that implements gain adjustment in a differential configuration of a circuit similar to circuit 300 of FIG. 3, using a continuous-time multi-bit delta-sigma modulator functioning as an ADC. As with circuit 300, in circuit 600 the balancing of gain occurs entirely in the analog domain.

In circuit 600, a subcircuit 616 that functions as a PGA comprises resistors $R_{1a}$ and $R_{1b}$, resistors $R_{2a}$ and $R_{2b}$, and amplifier A1. Resistors $R_{1a}$ and $R_{1b}$ of equal resistance to each other provide fixed input resistance to amplifier A1, while resistors Rea and $R_{2b}$, also of equal resistance to each other but not necessarily to $R_{1a}$ and $R_{1b}$, control the variable feedback resistance of the PGA. The gain of subcircuit 616 is thus defined by the ratio between $R_2$ and $R_1$.

A multi-bit delta-sigma modulator 618 that functions as an ADC comprises resistors $R_{3a}$, $R_{2b}$, $R_{4a}$ and $R_{4b}$, a sampling circuit H(s), a multi-bit quantizer, and a digital-to-analog converter (DAC) that feeds back the output of the quantizer to the input of sampling circuit H(s). Similarly to subcircuit 616, resistors $R_{3a}$ and $R_{3b}$ control the variable input resistance of delta-sigma modulator 618, while resistors $R_{4a}$ and $R_{4b}$ provide fixed output resistance of the feedback DAC, and thus of delta-sigma modulator 618. The gain of delta-sigma modulator 618 is thus similarly defined by the ratio between $R_3$ and $R_4$.

The gain of the signal path of circuit 600 can be expressed as the product of the gain of subcircuit (PGA) 616 and delta-sigma modulator (ADC) 618, or:

$$G_{total} = G_{PGA} \cdot G_{ADC} = \left(\frac{R_2}{R_1}\right) \cdot \left(\frac{R_4}{R_3}\right) = \left(\frac{R_4}{R_1}\right) \cdot \left(\frac{R_2}{R_3}\right)$$

where $G_{total}$ is the total gain of the signal chain, $G_{PGA}$ is the gain of the PGA stage, and $G_{ADC}$ is the gain of the ADC stage. One of skill in the art will appreciate that it is desirable to keep the total gain of the signal chain constant, and that this may be accomplished by modifying the values of any of the resistors $R_1$ to $R_4$ as long as one or more of the other resistor values are modified to compensate.

However, one of skill in the art will also appreciate that it is desirable that positive gain occurs early in the chain and attenuation occurs later, thus allowing output noise to be lowered, rather than having positive gain occur later and increase any noise. As above, the gain of PGA subcircuit 616 is defined by the ratio between $R_2$ and $R_1$ and its gain is thus increased when $R_2$ is increased if $R_1$ is not changed, i.e., is a resistor of fixed value as shown in circuit 600.

Further, in the embodiment of circuit 600, $R_4$ is also a resistor of fixed value. Thus, as will be apparent from the equation above, when the ratio between $R_4$ and $R_1$ is fixed, the total gain will be kept constant if the ratio between the two variable resistors $R_2$ and $R_3$ is kept constant. In practice, known layout techniques can be employed to keep $R_2$ and $R_3$ well matched to minimize the signal chain variation; the matching of resistors to within 0.1% can be readily achieved in most processes. This results in negligible total gain error in the signal path.

One of skill in the art will appreciate that an alternative embodiment would keep $R_2$ fixed and reduce $R_1$ and $R_4$ rather than increasing $R_2$ as above, and using the gain formula above will be able to implement such a circuit that will provide the desired total gain $G_{total}$. However, a designer may wish to avoid changing $R_4$ as this will change the output impedance of the ADC, and impact how the ADC responds to high signals versus low signals.

One of skill in the art will also appreciate that impedances may be provided by elements other than resistors, and that the gain of a PGA and an ADC may be adjusted by adjusting the impedances of such elements, or of resistors, in configurations other than that shown in circuit 600 and still fall within the present approach. In such embodiments it will be desirable to keep the ratio of the gain of the PGA and the gain of the ADC, and thus the overall gain of the signal chain, constant as the impedances are adjusted, and to have the positive gain occur early in the signal chain and the attenuation occur later to minimize noise in the final signal.

Figure 4:
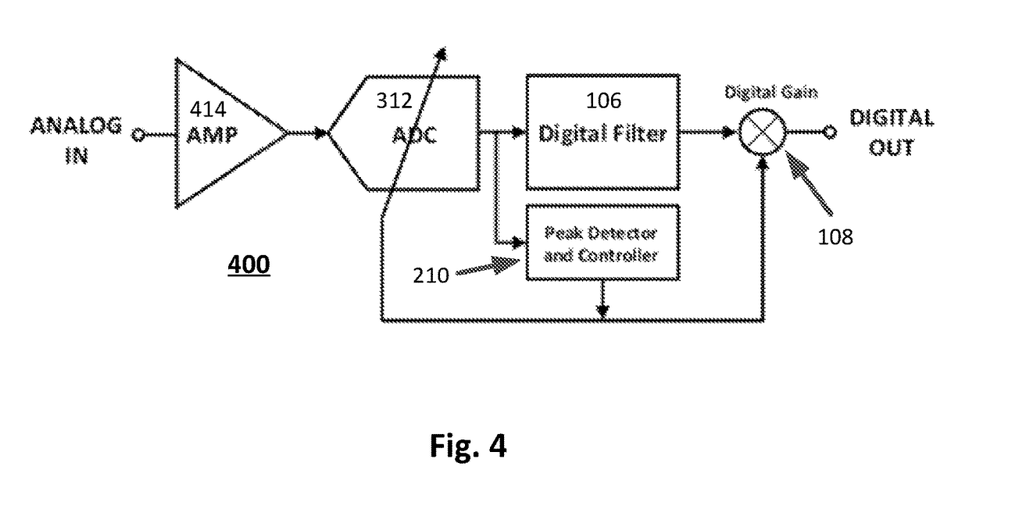
FIG. 4 is a block diagram of a circuit that provides dynamic range enhancement of an ADC according to another embodiment under the present approach.
Figure 5:
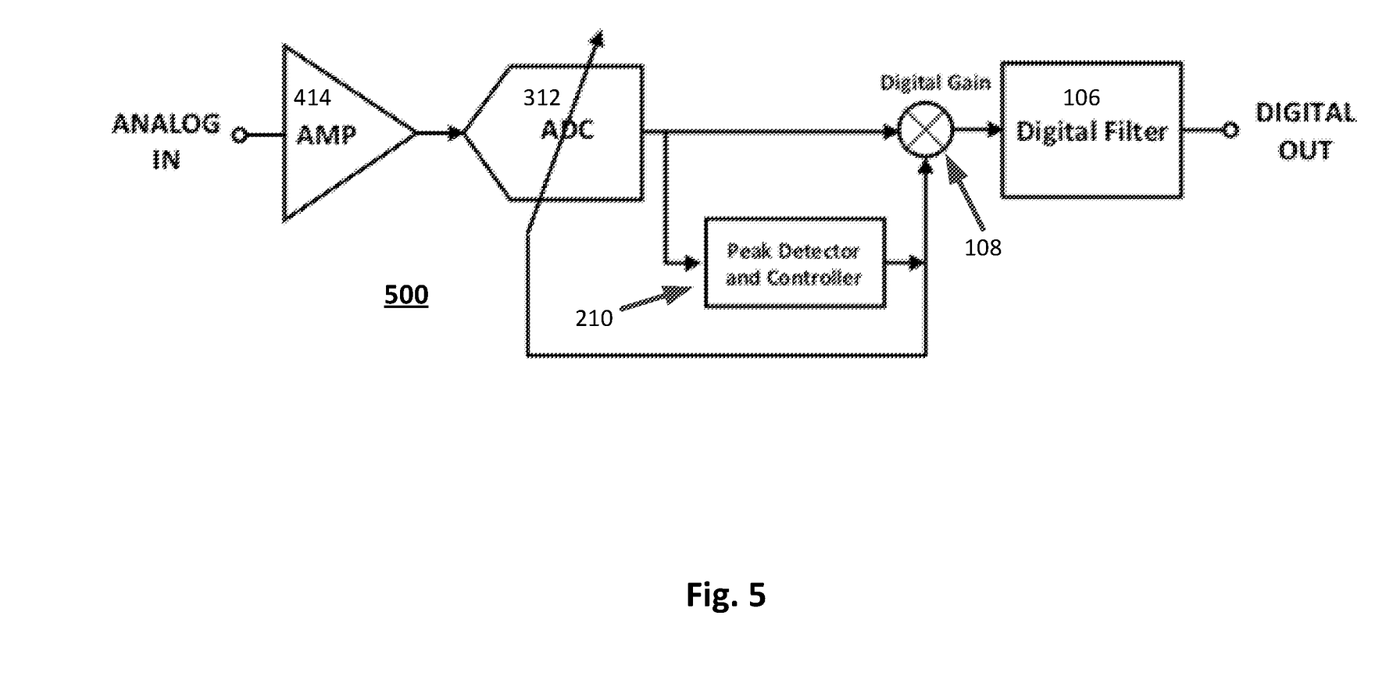
FIG. 5 is a block diagram of a circuit that provides dynamic range enhancement of an ADC according to yet another embodiment under the present approach.

FIGS. 4 and 5 are diagrams of circuits 400 and 500, respectively, that provide dynamic range enhancement of an ADC according to the second embodiment of the present approach. In this embodiment, the ADC gain is dynamically adjusted based upon the level of the input signal to the ADC 312, which again has an adjustable gain, while the gain of a digital gain element 108 is adjusted to compensate for the gain of ADC 312, thus balancing the gain of the circuit. There is no PGA as in circuits 100, 200 or 300 in FIGS. 1, 2 and 3, respectively, since no gain adjustment is done there. Thus, if it is desired to amplify the input signal before ADC 312, a simple fixed-gain amplifier 414 is used rather than a PGA such as PGA 102 in FIGS. 1, 2 and 3 above.

While in this second embodiment all of the gain does not occur in the analog domain as in the first embodiment, it does have an advantage over the prior art in that a fixed-gain amplifier is generally less complex and costly than a PGA. Further, in some instances, even the fixed-gain amplifier 414 may be omitted. However, it is desirable that the source of the signal received by the ADC be of low impedance, which can be provided by an amplifier 414 (or a PGA of the prior art or the first embodiment described above) having a low output impedance. Omitting amplifier 414 entirely will thus be more difficult to implement efficiently.

As in circuit 300 of FIG. 3, and in prior art circuits 100 and 200 of FIGS. 1 and 2, respectively, in circuits 400 and 500 a digital filter 106 filters the digital signal produced by ADC 312. One of skill in the art will appreciate how to select an appropriate type of digital filter 106 depending upon the input signal, the intended use of the circuit, etc.

As may be seen in FIGS. 4 and 5, digital gain element 108 may be inserted either before or after digital filter 106. In circuit 400 of FIG. 4, digital gain element 108 is located after digital filter 106, while in circuit 500 of FIG. 5 digital gain element 108 is located before digital filter 106.

Figure 7:
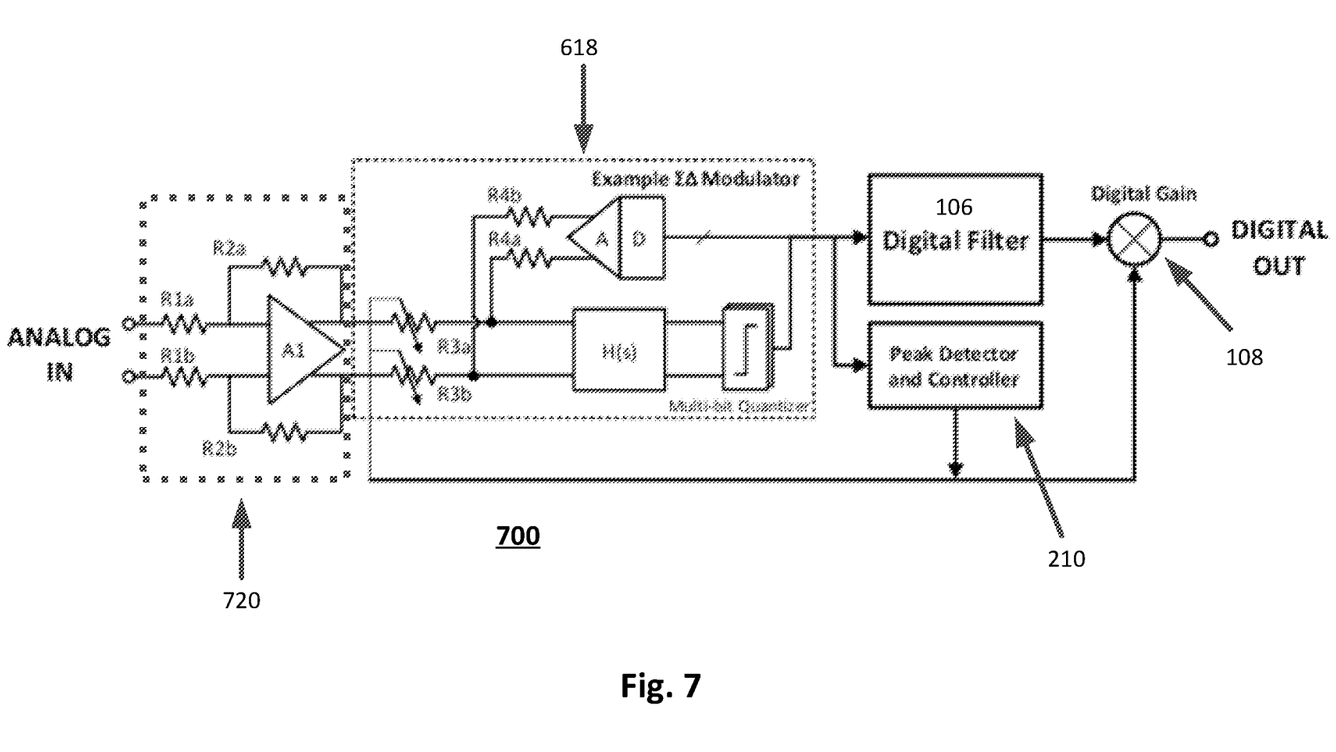
FIG. 7 is a diagram of a differential circuit that provides dynamic range enhancement of an ADC according to yet another embodiment under the present approach.
Figure 8:
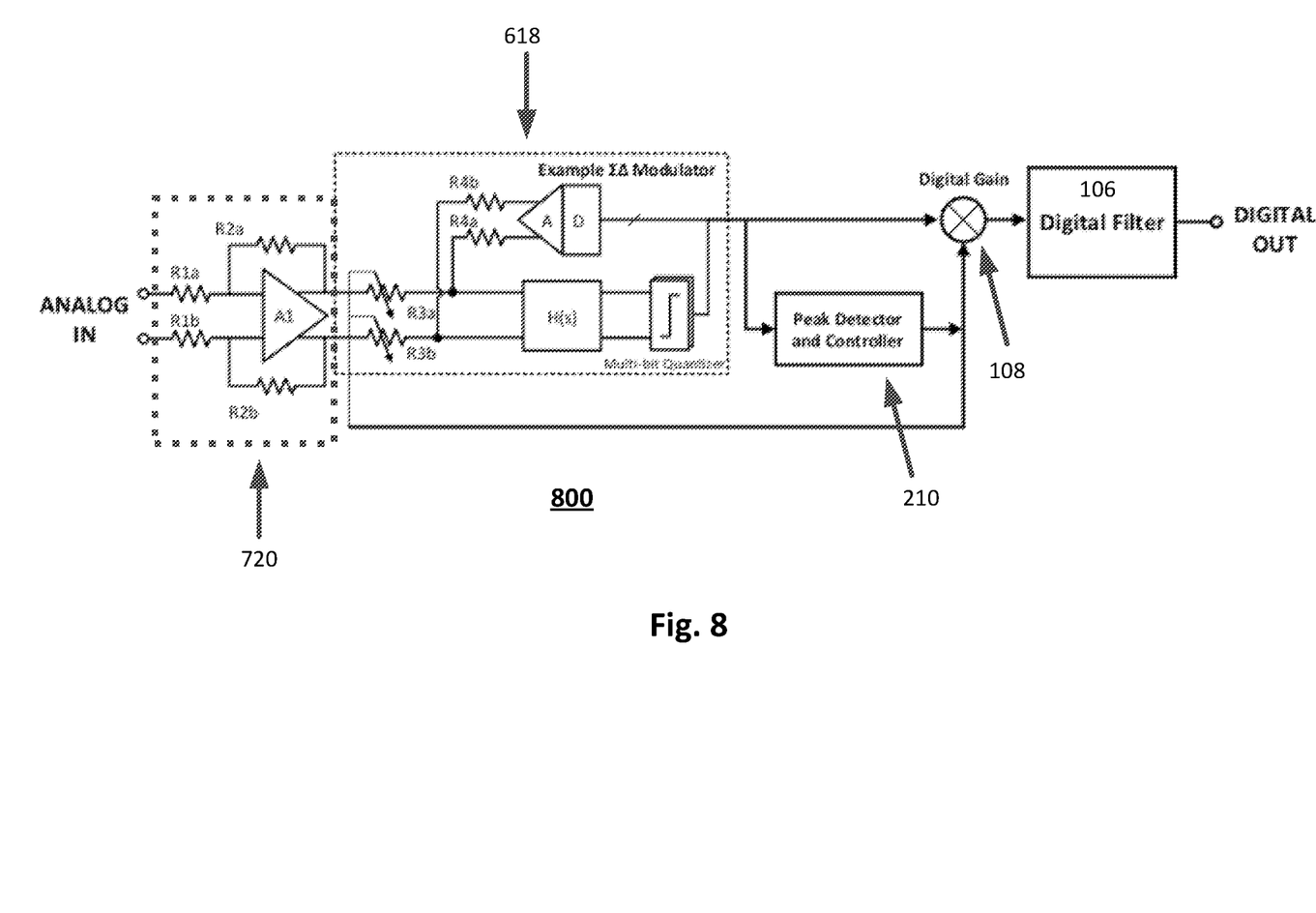
FIG. 8 is a diagram of a differential circuit that provides dynamic range enhancement of an ADC according to still another embodiment under the present approach.

FIGS. 7 and 8 are diagrams of circuits 700 and 800, respectively, that implement gain adjustment in differential configurations of circuits similar to circuits 400 and 500 of FIGS. 4 and 5, respectively, using a continuous-time multi-bit delta-sigma modulator functioning as an ADC. As in circuits 400 and 500 above, the difference between circuits 700 and 800 is whether the digital gain element 108 is located before or after the digital filter 106.

As in circuit 600 of FIG. 6 above, in circuits 700 and 800 the resistance of resistors $R_{3a}$ and $R_{3b}$ is adjusted to control the gain of the ADC, i.e., the delta-sigma modulator 618. However, as with circuits 400 and 500 above, in circuits 700 and 800 the gain of the delta-sigma modulator 618 is balanced by gain in digital gain element 108, rather than by gain in a PGA as in circuits 300 and 600. Thus, in circuits 700 and 800, the input amplifier subcircuit 720 has a fixed gain, set by selection of the values of resistors $R_{1a}$, $R_{1b}$, $R_{2a}$ and $R_{2b}$, rather than the adjustable gain of PGA subcircuit 616 in circuit 600 of FIG. 6.

As above, one of skill in the art will appreciate that the PGA, such as PGA 102 in FIGS. 2 and 3 or subcircuit 616 in FIG. 6, or the fixed amplifier, such as amplifier 412 in FIGS. 4 and 5 or subcircuit 720 in FIGS. 7 and 8, should be located at the input end of the circuit, and should be the first element to receive the input signal. This allows any gain from the PGA or amplifier to come before a subsequent attenuation of the signal, so that any noise generated by the PGA or amplifier is later reduced by the subsequent element that attenuates the signal to balance the overall gain. It will be apparent that if attenuation came before the PGA or amplifier, the noise from the PGA or amplifier in the final signal would be higher than in a configuration in which the PGA or amplifier comes first.

In FIG. 7 and FIG. 8, the example implementations of the proposed dynamic range enhancement illustrated in FIG. 4 and FIG. 5, respectively, the gain of the ADC is controlled through tuning the resistance of resistors $R_{3a}$ and $R_{3b}$. The total gain change in the ADC is then compensated in the digital gain block, which can be placed either before or after the digital filter.

Figure 9:
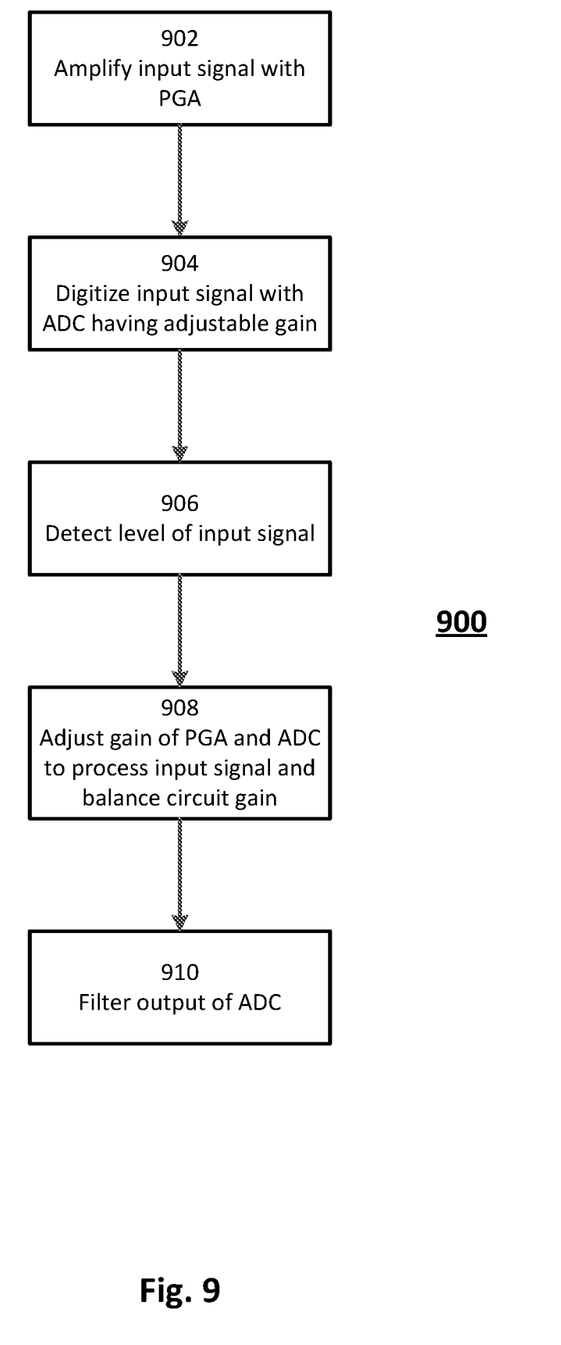
FIG. 9 is a flowchart of a method of providing dynamic range enhancement of an ADC according to one embodiment under the present approach.

FIG. 9 is a flowchart of a method 900 of providing dynamic range enhancement of an ADC according to one embodiment under the present approach. In this embodiment, as in circuits 300 and 600 of FIGS. 3 and 6 above, respectively, the gain of the circuit occurs in the analog domain and is balanced by adjusting the gain of a PGA and the gain of the ADC.

At step 902, a PGA, such as PGA 102 in circuit 300 of FIG. 3 and PGA subcircuit 616 in circuit 600 of FIG. 6, respectively (and in the prior art of FIGS. 1 and 2), amplifies an input signal.

At step 904 an ADC having adjustable gain, such as ADC 312 of FIGS. 3, 4 and 5, or subcircuit 618 of FIGS. 6, 7 and 8, digitizes the (now amplified) input signal.

At step 906 a controller, such as peak detector and controller 210 in FIGS. 2 through 8, detects the level of the input signal and, at step 908, adjusts the gain of the PGA to a level sufficient to amplify the input signal to a level appropriate for processing, and adjusts the gain of the ADC to a level sufficient to balance the gain of the circuit and keep the overall gain at the desired level.

At step 910, the output of the ADC is filtered by, for example, digital filter 106 in the figures herein. One of skill in the art will be able to select an appropriate filter for a given application.

It will be appreciated that each of these steps occurs continuously as the circuit is operating, and that the steps may overlap or appear to occur approximately simultaneously. For example, as seen in FIGS. 3 and 6, filtering of the digital signal from the ADC may occur at or about the same time as the determining of the level of the input signal, as both the digital filter and the controller receive the output from the ADC.

Figure 10:
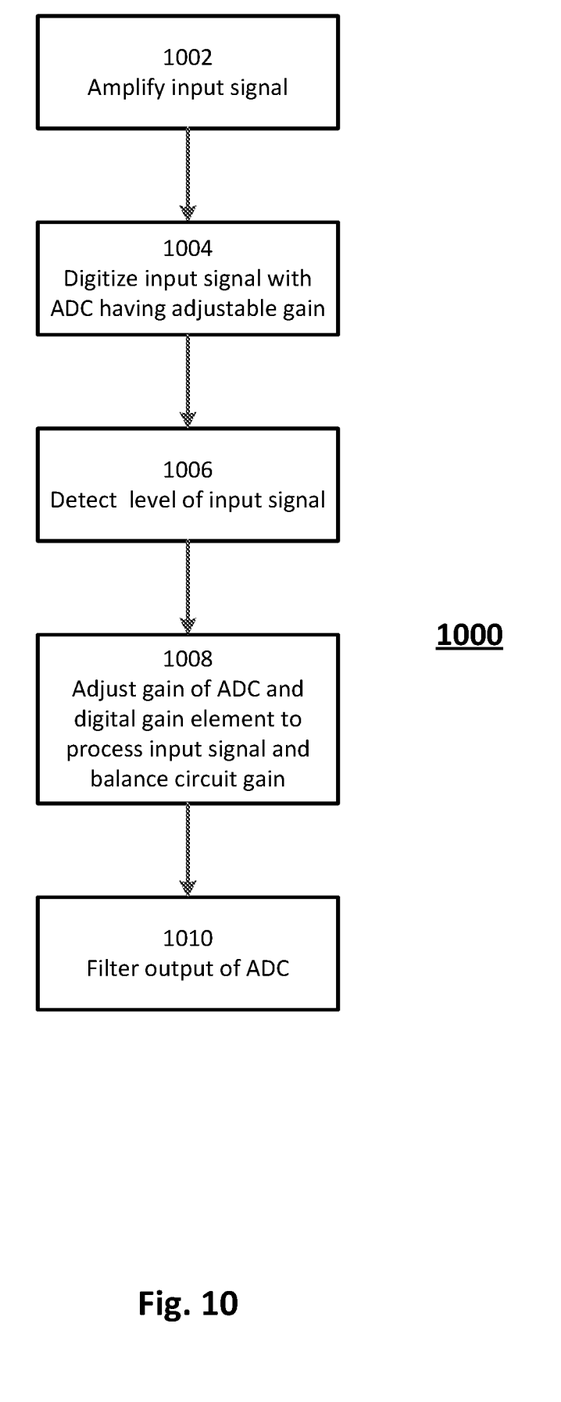
FIG. 10 is a flowchart of a method of providing dynamic range enhancement of an ADC according to another embodiment under the present approach.

FIG. 10 is a flowchart of a method 1000 of providing dynamic range enhancement of an ADC according to another embodiment under the present approach. In this embodiment, as in circuits 400, 500, 700 and 800 of FIGS. 4, 5, 7 and 8 above, respectively, the gain of the circuit is balanced by adjusting the gain of the ADC and the gain of a digital gain element.

At step 1002, a fixed-gain amplifier, such as amplifier 414 in circuits 400 and 500 of FIGS. 4 and 5, and subcircuit 720 in circuits 700 and 800 of FIGS. 7 and 8, respectively, amplifies an input signal.

At step 1004 an ADC having adjustable gain, such as ADC 312 of FIGS. 3, 4 and 5, or subcircuit 618 of FIGS. 6, 7 and 8, digitizes the (now amplified) input signal.

At step 1006 a controller, such as peak detector and controller 210 in FIGS. 2 through 8, detects the level of the analog input signal and, at step 1008, adjusts the gain of the ADC to a level sufficient to amplify the input signal to a level appropriate for processing, and adjusts the gain of a digital gain element to a level sufficient to balance the gain of the circuit and keep the overall gain at the desired level.

At step 1010, the amplified digital signal from the digital gain element is filtered by, for example, digital filter 106 in the figures herein. In an alternative embodiment, the digital signal output of the ADC is filtered before it is amplified (or attenuated) by the digital gain element. As above, one of skill in the art will be able to select an appropriate filter for a given application.

It will be appreciated that each of these steps occurs continuously as the circuit is operating, and that the steps may overlap or appear to occur approximately simultaneously. For example, as seen in FIGS. 4 and 7, filtering of the digital signal from the ADC may occur at or about the same time as the determining of the level of the input signal, as both the digital filter and the controller receive the output directly from the ADC in those embodiments.

By combining these features, it is possible to construct a circuit that enhances the dynamic range of a circuit containing an ADC. In one embodiment, the present approach eliminates issues such as gain synchronization, gain mismatch, etc., by balancing gain exclusively within either the analog or digital domain. In another embodiment, a PGA may be either replaced by a fixed-gain amplifier or omitted entirely. One of skill in the art will appreciate that ADCs appropriate for digitizing a wide variety of signals may be constructed according to these principles.

The disclosed system has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as explained herein and is well understood by those of skill in the art, various design choices will be apparent depending upon the desired signal or application to be addressed by an ADC. Further, the illustration of transistors and the associated feedback loops, resistors, etc., is exemplary; one of skill in the art will be able to select the appropriate number of transistors and related elements that is appropriate for a particular application.

These and other variations upon the embodiments are intended to be covered by the present disclosure, which is limited only by the appended claims.

What is claimed is:

1. A circuit that enhances the dynamic range of an analog-to-digital converter, comprising:
   a programmable gain amplifier configured to receive an analog input signal and produce an amplified analog signal;
   an analog-to-digital converter having adjustable gain and configured to receive and digitize the amplified analog signal, and to output a digital signal; and
   a controller configured to:
      detect the level of the analog input signal; and
      adjust the gain of the programmable gain amplifier and the gain of the analog-to-digital converter based upon the detected analog input signal level;
   wherein:
      the programmable gain amplifier comprises a first element of adjustable impedance and is configured to change gain in response to the value of the impedance of the first element;
      the analog-to-digital converter comprises a second element of adjustable impedance and is configured to change gain in response to the value of the impedance of the second element;
      whereby the total gain of the circuit is responsive to the ratio of the values, and may be kept constant by maintaining a selected ratio of the impedances of the first and second elements.

2. The circuit of claim 1 further comprising a digital filter configured to receive and filter the amplified digital signal.

3. A circuit that enhances the dynamic range of an analog-to-digital converter, comprising:
   a programmable gain amplifier configured to receive an analog input signal and produce an amplified analog signal;
   an analog-to-digital converter having adjustable gain and configured to receive and digitize the amplified analog signal, and to output a digital signal; and
   a controller configured to:
      detect the level of the analog input signal; and adjust the gain of the programmable gain amplifier and the gain of the analog-to-digital converter based upon the detected analog input signal level;
  wherein the analog-to-digital converter comprises a delta-sigma modulator; and wherein the delta-sigma modulator comprises:
    first and second adjustable resistors each having a first end and a second end, and configured to receive an input differential analog signal at the first ends;
    a sampling circuit having two inputs and two outputs, a first input connected to the second end of the first resistor and a second input connected to the second end of the second resistor, and configured to receive the input differential analog signal from the resistors and produce a series of differential output values representing samples of the input differential analog signal;
    a multi-bit quantizer configured to receive the differential output values from the sampling circuit and produce a series of digital values corresponding to the differential output values from the sampling circuit;
    a digital-to-analog converter having an input and two outputs configured to receive the series of digital values from the multi-bit quantizer and convert them into a reconstituted differential analog signal; and
    first and second feedback resistors of a fixed value each having a first end and a second end, and configured to receive the reconstituted differential analog signal from the digital-to-analog converter at the first ends, the second end of the first feedback resistor connected to the first input of the sampling circuit and the second end of the second feedback resistor connected to the second input of the sampling circuit;
  whereby the gain of the sigma-delta modulator may be adjusted by adjusting the value of the first and second adjustable resistors.

\* \* \* \* \*